(12) United States Patent
Farnham et al.

(10) Patent No.: US 8,034,534 B2
(45) Date of Patent: Oct. 11, 2011

(54) FLUORINATED POLYMERS FOR USE IN IMMERSION LITHOGRAPHY

(75) Inventors: William Brown Farnham, Hockessin, DE (US); Suniti Moudgil, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 174 days.

(21) Appl. No.: 12/305,265

(22) PCT Filed: Aug. 14, 2007

(86) PCT No.: PCT/US2007/017869
§ 371 (c)(1),
(2), (4) Date: Dec. 17, 2008

(87) PCT Pub. No.: WO2008/021291
PCT Pub. Date: Feb. 21, 2008

(65) Prior Publication Data
US 2009/0253074 A1 Oct. 8, 2009

Related U.S. Application Data

(60) Provisional application No. 60/837,533, filed on Aug. 14, 2006.

(51) Int. Cl.
G03F 7/038 (2006.01)
G03F 7/039 (2006.01)
G08F 18/20 (2006.01)
G08F 18/02 (2006.01)
G08F 218/02 (2006.01)

(52) U.S. Cl. ............... 430/270.1; 430/907; 430/910; 526/245; 526/329.4

(58) Field of Classification Search .............. None
See application file for complete search history.

(56) References Cited

U.S. PATENT DOCUMENTS

| 6,379,874 B1 | 4/2002 | Ober et al. | |
| 2002/0051936 A1* | 5/2002 | Harada et al. | 430/270.1 |
| 2006/0246373 A1* | 11/2006 | Wang | 430/270.1 |
| 2008/0299503 A1* | 12/2008 | Ishiduka et al. | 430/325 |

FOREIGN PATENT DOCUMENTS

| EP | 0 910 587 B1 | 12/2001 |
| WO | WO 98/01478 | 1/1998 |
| WO | WO 99/31144 | 6/1999 |
| WO | WO 00/66575 | 11/2000 |
| WO | WO 02/21213 A2 | 3/2002 |
| WO | WO 2005/031461 A1 | 4/2005 |
| WO | WO 2005/031462 A1 | 4/2005 |
| WO | WO2006/070695 A1 * | 7/2006 |

OTHER PUBLICATIONS

T.-Y Lee et al., Advances in Resist Technology and Processing XX, Theodore H. Fedynyshyn, Editor, Proceedings of SPIE, vol. 5039 (2003), pp. 548-557.
M. Mishra et al., "Handbook of Radical Vinyl Polymerization", Marcel Dekker, Inc., 1998. Handbook Not Included.
Y. Wei et al., Advances in Resist Technology and Processing XXIII, edited by Q. Lin, Proc. of SPIE, vol. 6153, 615306, (2006).
Xiang Maoliang, et al., Semifluorinated Groups As Building Blocks for Ordered Polymers, Papers Presented at the Meeting—American Chemical Society, Division of Polymer Chemistry, XX, XX, vol. 39, No. 2, Aug. 1998, pp. 974-975, XP001248281, ISSN: 0032-3934, the whole document.
Hiroshi Ito, Toyoko Imae, Tetsuya Nakamura, Motoyuki Sugiura, Yoshihiro Oshibe: "Self-Association of Water-Soluble Fluorinated Diblock Copolymers in Solutions", Journal of Colloid and Interface Science, vol. 276, Apr. 21, 2004, pp. 290-298, XP002472763, abstract, figure 1; table 1, paragraph [02.1].
Tadanori Koga, Shuiqin Zhou, Benjamin Chu: "Dynamic Light-Scattering Study of Self-Assembly of Diblock Copolymers in Supercritical Carbon Dioxide", Applied Optics, vol. 40, No. 24, Aug. 20, 2001, pp. 4170-4178, XP002472764, abstract, p. 4171, col. 1, paragraph 3—col. 2, paragraph 1.

* cited by examiner

*Primary Examiner* — Sin J. Lee
(74) *Attorney, Agent, or Firm* — Konrad H. Kaeding

(57) ABSTRACT

The present invention relates to partially fluorinated (meth) acrylic polymers that can be blended with other (meth)acrylic polymers to provide enhanced surface properties.

1 Claim, No Drawings

FLUORINATED POLYMERS FOR USE IN IMMERSION LITHOGRAPHY

FIELD OF THE INVENTION

The present invention relates to partially fluorinated (meth) acrylic polymers that can be blended with photoresist polymers to provide enhanced surface properties.

BACKGROUND

A highly optimized conventional 193 nm-ArF photolithography system has a resolution limit of 52 nm. By contrast, the resolution limit for 193 nm immersion lithography in water is about 35 nm. This difference is motivating the search for solutions to the many practical issues of implementing immersion lithography.

As described by Y. Wei et al., Advances in Resist Technology and Processing XXIII, edited by Q. Lin, Proc. of SPIE Vol. 6153, 615306, (2006), topcoats are being developed to reduce the leaching of photoresist components into the immersion fluid, which is most often water. Another function of the topcoat is to provide a very hydrophobic surface to reduce water droplets or water mark defects. But the topcoat approach requires a separate step to apply the topcoat, and the topcoat must also be cleanly and completely removed after the post-exposure bake step to avoid the formation of blob defects.

WO2002021213 discloses resins and photoresist compositions that comprise such resins. The resins include photo-acid-labile deblocking groups, wherein the acid-labile moiety is substituted with one or more electron-withdrawing groups, e.g., perfluoroalkyl groups. The polymers are useful as a resin binder component of chemically-amplified positive-acting resists that can be effectively imaged at wavelengths below 300 nm.

RAFT (reversible addition fragmentation chain transfer) polymerization processes have been disclosed for the preparation of low-polydispersity polymers from acrylic, styrenic and selected other vinyl monomers. (WO 98/01478, WO 99/31144, WO05031462B1, WO05031461A1, and EP 0 910, 587). Fields of application for these RAFT-derived polymers include imaging and electronics (e.g., photoresists).

T.-Y Lee et al., (Advances in Resist Technology and Processing XX, Theodore H. Fedynyshyn, Editor, Proceedings of SPIE, Vol. 5039 (2003), pp 548-557) have disclosed the preparation of acrylate terpolymers using RAFT processes.

M. Mishra et al. have reviewed useful methods for the preparation of acrylate polymers ("Handbook of Radical Vinyl Polymerization", Marcel Dekker, Inc., 1998).

There is a continuing need to develop photoresist compositions that display high contact angles with water and other immersion fluids.

SUMMARY

One aspect of this invention is a block copolymer of the form $A_m$-$B_n$ with Mw=2,000-25,000, wherein
m is an integer from 4-75;
n is an integer from 2-20;
each A is independently selected and is a repeat unit derived from an acrylic monomer, $CH_2=CR^1CO_2R^2$, wherein
  $R^1$ is selected from the group consisting of H, F, $C_1$-$C_5$ alkyl, and $C_1$-$C_5$ fluoroalkyl;
  $R^2$ is selected from the group consisting of $C_1$-$C_{20}$ acyclic alkyl, $C_5$-$C_{50}$ cyclic alkyl, and $C_7$-$C_{50}$ polycyclic alkyl; and each B is independently selected and is a repeat unit derived from $CH_2=CR^3CO_2R^4$, wherein
  $R^3$ is selected from the group consisting of H, F, $C_1$-$C_5$ alkyl, and $C_1$-$C_5$ fluoroalkyl; and
  $R^4$ is selected from the group consisting of —$C(R^5)(R^6)$$(CH_2)_pR_f$, —$C(R^5)((CH_2)_pR_f)_2$, —$(CH_2)_pR_f$, and —$(CH_2)_pO(CH_2)_pR_f$ wherein
    p is an integer from 1 to 4;
    $R_f$ is $C_2$-$C_{14}$ perfluoroalkyl; and
    $R^5$ and $R^6$ are independently selected from the group consisting of H, $C_1$-$C_3$ alkyl, or taken together form a 5- or 6-membered ring.

Another aspect of this invention is a photoresist comprising the block copolymer of this invention and a photoactive component.

Another aspect of this invention is a blend comprising the photoresist composition of this invention.

Another aspect of this invention is a process for forming a photoresist image on a substrate, comprising
  a. forming a photoresist layer on a substrate, wherein the photoresist comprises a block copolymer of this invention and a photoactive component;
  b. imagewise exposing the photoresist layer to actinic radiation to form imaged and non-imaged areas; and
  c. developing the exposed photoresist layer having imaged and non-imaged areas to form the photoresist image on the substrate.

DETAILED DESCRIPTION

The block copolymer, $A_m$-$B_n$, comprises an "A" block and a "B" block. The "A" block comprises 8-75 (meth)acrylate repeat units, where each repeat unit is derived from an acrylic monomer of the form, $CH_2=CR^1CO_2R^2$, wherein $R^1$ is selected from the group consisting of H, F, $C_1$-$C_5$ alkyl, and $C_1$-$C_5$ fluoroalkyl; and $R^2$ is selected from the group consisting of $C_1$-$C_{20}$ acyclic alkyl, $C_5$-$C_{50}$ cyclic alkyl, and $C_7$-$C_{50}$ polycyclic alkyl. The term "(meth)acrylate" refers to both acrylate and methacrylate polymers. Similarly, the term "polymer" is inclusive of both homopolymers and copolymers.

Preferably $R^1$ is a $C_1$-$C_5$ alkyl group.

$R^2$ can be an acid-labile group. In one embodiment, $R^2$ is a $C_5$-$C_{50}$ polycyclic group, preferably $C_5$-$C_{30}$, optionally with one or more hydroxyl substituents. $R^2$ can also be optionally substituted by one or more halogen, ether oxygen, ester or ketone carbonyl groups.

$R^2$ can be a functional group of the formula:

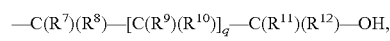

$$—C(R^7)(R^8)—[C(R^9)(R^{10})]_q—C(R^{11})(R^{12})—OH,$$

wherein
q=0, 1, 2, 3, 4 or 5;
$R^7$ and $R^8$ are independently selected from the group consisting of $C_1$-$C_6$ alkyl and $C_1$-$C_6$ alkyl substituted with an ether oxygen; or $R^7$ and $R^8$ taken together form a 3- to 8-membered ring, optionally substituted with an ether oxygen, provided that the carbon attached to $R^7$ and $R^8$ is not at a bridgehead position;
$R^9$ and $R^{10}$ are independently selected from the group consisting of H, $C_1$-$C_6$ alkyl, and $C_1$-$C_6$ alkyl substituted with an ether oxygen; or $R^9$ and $R^{10}$ taken together form a 3- to 8-membered ring, optionally substituted with an ether oxygen;
$R^{11}$ and $R^{12}$ are independently selected from the group consisting of H, $C_1$-$C_6$ alkyl, and $C_1$-$C_6$ alkyl substituted with an ether oxygen; or $R^{11}$ and $R^{12}$ taken together form a 3- to 8-membered ring, optionally substituted with an ether oxygen; or $R^7$ and $R^{11}$ taken together with —[C($R^9$)($R^{10}$)]$_q$— form a 4- to 8-membered ring, provided that the carbon attached to $R^7$ and $R^8$ is not at a bridgehead position.

Acrylate and methacrylate monomers suitable for use in the "A" block include, but are not limited to: 2-methyl-2-adamantyl (meth)acrylate; 2-ethyl-2-adamantyl-(meth)acrylate; 2-propyl-2-adamantyl-(meth)acrylate; 2-(1-adamantyl)-2-propyl-(meth)acrylate; α-(γ-butyrolactone)-(meth)acrylate; β-(γ-butyrolactone)-(meth)acrylate; 3-hydroxy-1-adamantyl-(meth)acrylate; 8-methyltricyclo[5.2.1]decan-8-yl-(meth)acrylate; 8-ethyltricyclo[5.2.1]decan-8-yl-(meth)acrylate; 2-(4-methoxybutyl)-2-adamantyl-(meth)acrylate; mevalonic lactone-(meth)acrylate; PinAc; PinMAc; exo-3-(2,2-bis(trifluoromethyl)-2-hydroxyethyl)-endo-2-(2-methylpropenoyl)-bicyclo[2.2.1]heptane; exo-3-(2,2-bis(trifluoromethyl)-2-hydroxyethyl)-endo-2-(propenoyl)-bicyclo[2.2.1]heptane; 4-hydroxy-1-methylcyclohexyl-(meth)acrylate; 1-methylcyclopentyl-(meth)acrylate; 1-ethylcyclopentyl-(meth)acrylate; and 5-(meth)acryloyloxy-2,6-norbornanecarbolactone.

Preferred cyclic acrylic monomers include 3-hydroxy-1-adamantyl methacrylate ($CH_2$=C($CH_3$)$CO_2R^2$, wherein $R^2$ is 3-hydroxy-1-adamantyl); 2-ethyl-2-adamantyl methacrylate; 1-ethylcyclopentyl-methacrylate (ECPMA); 2-methyl-2-adamantyl methacrylate (MAMA); 5-methacryloyloxy-2,6-norbornanecarbolactone (NBLMA); and γ-butyrolactone methacrylate, both α- and β-isomers.

The "B" block comprises fluorinated repeat units derived from monomers of the form $CH_2$=$CR^3CO_2R^4$, wherein $R^3$ is selected from the group consisting of H, F, $C_1$-$C_5$ alkyl, and $C_1$-$C_5$ fluoroalkyl. $R^4$ is selected from the group fluoroalkyls and fluoroethers consisting of —C($R^5$)($R^6$)($CH_2$)$_p R_f$, —C($R^5$)(($CH_2$)$_p R_f$)$_2$, —($CH_2$)$_p R_f$, and —($CH_2$)$_p$O($CH_2$)$_p R_f$, wherein p is an integer from 1 to 4; and $R_f$ is $C_2$-$C_{14}$ perfluoroalkyl. $R^5$ and $R^6$ are independently selected from the group consisting of H, $C_1$-$C_3$ alkyl, or taken together form a 5- or 6-membered ring.

In one embodiment, $R^3$ is $CH_3$; $R^4$ is —C($R^5$)($R^6$)($CH_2$)$_p$ $R_f$, —($CH_2$)$_p R_f$ or —($CH_2$)$_p$O($CH_2$)$_p R_f$; $R_f$ is $C_4$-$C_{10}$ straight chain perfluoroalkyl; and $R^5$ and $R^6$ are $CH_3$.

Suitable fluorinated repeat units include those derived from 1H,1H,2H,2H-perfluorohexyl (meth)acrylate, 1H,1H,2H,2H-perfluorodecyl (meth)acrylate, 1H,1H,2H,2H-perfluorooctyl methacrylate ($C_6$-ZFM) and 1,1-dimethyl-2H,2H,3H,3H-perfluorononyl methacrylate (FUDMA).

Monomers A and B can be prepared from the corresponding acids and alcohols.

In one embodiment of this invention, the block copolymer further comprises a protected acidic group. The protecting group prevents the protected acidic group from exhibiting its acidity while in this protected form. A given protected acid group is normally chosen on the basis of its being acid-labile, such that when acid is produced upon imagewise exposure, the acid will catalyze deprotection of the protected acidic groups and production of hydrophilic acid groups that are necessary for development under aqueous conditions.

Suitable protected acidic groups include, but are not limited to: A) alkyl esters, or substituted alkyl esters, capable of forming, or rearranging to, a tertiary cation containing 4 or more carbon atoms; B) esters of lactones; C) acetal esters; D) α-cyclic ether esters; and E) esters which are easily hydrolyzable because of anchimeric assistance, such as MEEMA (methoxy ethoxy ethyl methacrylate). Specific examples in category A) include 2-methyl-2-adamantyl ester and isobornyl ester.

Suitable protected acidic groups also include protected acidic fluorinated alcohol groups (e.g., —C($R_f$)($R_f$)$OR_a$, where $R_a$ is not H) or other acid groups that can yield hydrophilic groups by the reaction with acids or bases. An alpha-alkoxyalkyl ether group (i.e., $R_a$=$CH_2OR_b$, $R_b$=$C_1$-$C_{11}$ alkyl) is a preferred protecting group for the fluoroalcohol group in order to maintain a high degree of transparency in the photoresist composition. An illustrative, but non-limiting, example of an alpha-alkoxyalkyl ether group that is effective as a protecting group is methoxy methyl ether (MOM).

Carbonates formed from a fluorinated alcohol and a tertiary aliphatic alcohol can also be used as protected acidic fluorinated alcohol groups.

These block copolymers are useful for modifying the surface properties of materials. When applied to a solid surface with a high surface energy, they can provide contact angles of more than 60 degrees with oil and with water. Such high contact angles are associated with good oil- and water-repellency.

The block copolymers of this invention can be used to make photoresists by combining the block copolymer with at least one photoactive component, a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG). Several suitable photoacid generators are disclosed in WO 00/66575.

Suitable photoacid generators for this invention include, but are not limited to, 1) sulfonium salts (structure I); 2) iodonium salts (structure II), and 3) hydroxamic acid esters, such as structure III.

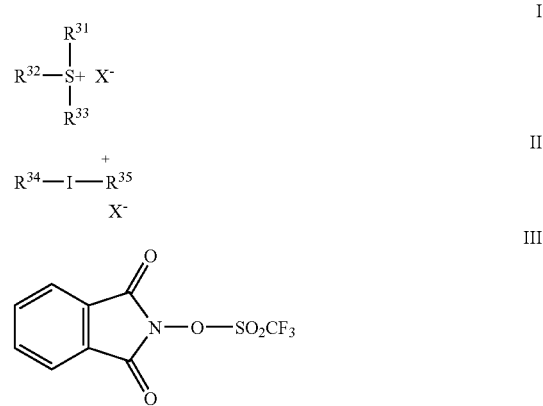

In structures I and II, $R^{31}$-$R^{35}$ are independently substituted or unsubstituted aryl or substituted or unsubstituted $C_7$-$C_{20}$ alkylaryl or aralkyl. Representative aryl groups include, but are not limited to, phenyl and naphthyl. Suitable substituents include, but are not limited to, hydroxyl (—OH) and $C_1$-$C_{20}$ alkyloxy (e.g., —$OC_{10}H_{21}$). The anion, $X^-$, in structures I and II can be, but is not limited to, $SbF_6^-$ (hexafluoroantimonate), $CF_3SO_3^-$ (trifluoromethanesulfonate=triflate), and $C_4F_9SO_3^-$ (nonafluoro-1-butanesulfonate).

These photoresists are readily imageable using wavelengths of 193 nm to 365 nm. When applied to a solid surface with a high surface energy, they also provide contact angles of more than 60 degrees with oil and with water. These photoresists could be useful for conventional lithography (in air) or for immersion lithography (e.g., in water).

Another aspect of this invention is a blend comprising:
a. a block copolymer of the form $A_m$-$B_n$ with Mw=2,000-25,000, wherein
m is an integer from 4-75;
n is an integer from 2-20;
each A is independently selected and is a repeat unit derived from an acrylic monomer, $CH_2=CR^1CO_2R^2$, wherein
   $R^1$ is selected from the group consisting of H, F, $C_1$-$C_5$ alkyl, and $C_1$-$C_5$ fluoroalkyl;
   $R^2$ is selected from the group consisting of $C_1$-$C_{20}$ acyclic alkyl, $C_5$-$C_{50}$ cyclic alkyl, and $C_7$-$C_{50}$ polycyclic alkyl; and
each B is independently selected and is a repeat unit derived from $CH_2=CR^3CO_2R^4$, wherein
   $R^3$ is selected from the group consisting of H, F, $C_1$-$C_5$ alkyl, and $C_1$-$C_5$ fluoroalkyl; and
   $R^4$ is selected from the group consisting of —$C(R^5)(R^6)$$(CH_2)_pR_f$, —$C(R^5)((CH_2)_pR_f)_2$, —$(CH_2)_pR_f$, and —$(CH_2)_pO(CH_2)_pR_f$, wherein
      p is an integer from 1 to 4;
      $R_f$ is $C_2$-$C_{14}$ perfluoroalkyl; and
   $R^5$ and $R^6$ are independently selected from the group consisting of H, $C_1$-$C_3$ alkyl, or taken together form a 5- or 6-membered ring; and
b. a (meth)acrylate (co)polymer,
wherein the weight ratio of A repeat units to B repeat units is 1:4 to 4:1; and
the weight ratio of the blend to B repeat units is 1:20 to 150:1.

In one embodiment, the (meth)acrylate (co)polymer of the blend comprises repeat units derived from an acrylic monomer, $CH_2=CR^{13}CO_2R^{14}$, wherein
   $R^{13}$ is selected from the group consisting of H, F, $C_1$-$C_5$ alkyl, and $C_1$-$C_5$ fluoroalkyl; and
   $R^{14}$ is selected from the group consisting of $C_1$-$C_{20}$ acyclic alkyl, $C_5$-$C_{50}$ cyclic alkyl, and $C_7$-$C_{50}$ polycyclic alkyl.

The blend of this invention can exhibit surprisingly high contact angles with both water and with hydrocarbons such as hexadecane, even at relatively low levels of the fluorinated block copolymer.

Another embodiment of this invention is a photoresist composition comprising the blend of this invention, wherein the block copolymer of the blend further comprises a protected acidic group and the (meth)acrylate polymer of the blend further comprises a protected acidic group, and the blend further comprises a photoactive component. These photoresists are particularly useful in immersion lithography because they provide the desired high water contact angle without requiring a separate topcoat, and they can be imaged and developed by methods commonly now used for 193 nm photolithography.

Various dissolution inhibitors can be added to photoresists derived from the polymers of this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions. Several suitable dissolution inhibitors are disclosed in WO 00/66575.

The (meth)acrylate polymers (i.e., the "b" component of the blend of this invention) can be prepared by radical vinyl polymerization, as reviewed by M. Mishra et al. ("Handbook of Radical Vinyl Polymerization", Marcel Dekker, Inc., 1998), which is hereby incorporated by reference. Following completion of the polymerization, the polymer can be isolated by precipitation with a non-solvent.

Alternatively these polymers can be prepared via "RAFT" polymerization processes, as disclosed in WO 98/01478, WO 99/31144, WO05031462B1, WO05031461A1, and EP 0 910,587, which are hereby incorporated by reference. RAFT polymerization processes can be used to provide polymers with narrow polydispersities, e.g., less than 2.0, less than 1.5 or less than 1.2, all at greater than 80% conversion. It is believed that polymers with controlled molecular weight and low polydispersity (e.g., less than 1.2) are especially suitable for photolithographic applications.

It is convenient to synthesize the fluorinated block copolymer by a RAFT polymerization process or by other controlled or "living radical" polymerization processes. Typically, the "$A_m$" portion of the block copolymer is synthesized first, and then the polymerization is continued in the presence of the fluorinated monomer, as is illustrated in Examples 2 and 3, below.

RAFT polymerization of (meth)acrylates is typically carried out by heating a solution of the monomers in the presence of a chain transfer agent and a radical initiator.

Suitable chain transfer agents for use in the RAFT polymerization process have the following formula:

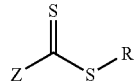

wherein:
R=alkyl, alkenyl, aryl, substituted alkyl, substituted aryl, aralkyl, carbocyclic or heterocyclic ring, alkylthio, or dialkylamino; and
Z=H, alkyl, aryl, aralkyl, substituted alkyl, substituted aryl, carbocyclic or heterocyclic ring, alkylthio, substituted alkylthio, arylthio, substituted arylthio, alkoxycarbonyl, aryloxycarbonyl, carboxy, acyloxy, carbamoyl, cyano, dialkyl- or diaryl-phosphonato, or dialkyl- or diaryl-phosphinato.

In a typical CTA useful in the process of this invention, R is capable of producing a radical that is comparable in stability to the growing polymer radical. Thus for acrylates, R is typically a primary or preferably a secondary alkyl group that is substituted with a CN, $CO_2H$, $CO_2R$ or phenyl group. For methacrylates, CTAs with tertiary leaving groups are preferred, e.g., wherein R is —$C(CH_3)(CN)CH_2CH_2CO_2H$.

Suitable CTAs include dithioesters, thiocarbonylthio compounds, benzyl (1,2-benzenedicarboximido)carbodithioate, 2-cyanoprop-2-yl 1-pyrrolecarbodithioate, 2-cyanobut-2-yl 1-pyrrolecarbodithioate, benzyl 1-imidazolecarbodithioate, xanthate derivatives such as O-ethyl S-(1-phenylethyl)xanthate, O-ethyl S-(2-ethoxycarbonylprop-2-yl)xanthate, and O-ethyl S-(2-cyanoisopropyl)xanthate. Preferred CTAs include dithioesters and trithiocarbonates, especially S-cyanomethyl-S-dodecyltrithiocarbonate and 4-cyano-4-(dodecylsulfanylthiocarbonyl)-sulfanyl pentanoic acid.

The molar ratio of free radical initiator to the RAFT chain transfer agent is typically about 0.05-10, or 0.1-2, or 0.2-1.

The source of initiating free radicals can include sources such as the thermally induced homolytic scission of a suitable compound(s) (such as peroxides, peroxyesters, hydroperoxides, persulfates, perborates, or azo compounds), the spontaneous generation from monomer, redox initiating systems, photochemical initiating systems or high energy radiation such as electron beam, X- or γ-radiation.

Examples of suitable sources of free radicals for the process include azo compounds and peroxides such as: 2,2'-azobis-(isobutyronitrile), 2,2'-azobis(2-cyano-2-butane), dimethyl 2,2'-azobis(methyl isobutyrate), 4,4'-azobis(4-cyanopentanoic acid), 4,4'-azobis(4-cyanopentan-1-ol), 1,1'-azobis(cyclohexanecarbonitrile), 2-(t-butylazo)-2-cyanopropane, 2,2'-azobis[2-methyl-N-(1,1)-bis-(hydroxymethyl)-2-hydroxyethyl] propionamide, 2,2'-azobis[2-methyl-N-hydroxyethyl)]-propionamide, 2,2'-azobis(N,N'-dimethylene-isobutyramidine) dihydrochloride, 2,2'-azobis (2-amidinopropane) dihydrochloride, 2,2'-azobis(N,N'-dimethyleneisobutyramine), 2,2'-azobis(2-methyl-N-[1,1-bis(hydroxymethyl)-2-hydroxyethyl] propionamide), 2,2'-azobis(2-methyl-N-[1,1-bis(hydroxymethyl)ethyl] propionamide), 2,2'-azobis[2-methyl-N-(2-hydroxyethyl) propionamide], 2,2'-azobis(isobutyramide) dihydrate, 2,2'-azobis(2,2,4-trimethylpentane), 2,2'-azobis(2-methylpropane), t-butyl peroxyacetate, t-butyl peroxy-benzoate, t-butyl peroxyoctoate, t-butyl peroxyneodecanoate, t-butyl-peroxy isobutyrate, t-amyl peroxypivalate, t-butyl peroxypivalate, di-isopropyl peroxydicarbonate, dicyclohexyl peroxydicarbonate, dicumyl peroxide, dibenzoyl peroxide, dilauroyl peroxide, potassium peroxy-disulfate, ammonium peroxydisulfate, di-t-butyl hyponitrite, di-t-butyl-peroxide or dicumyl hyponitrite.

Suitable photochemical initiator systems include benzoin derivatives, benzophenone, acyl phosphine oxides, and photo-redox systems.

Suitable redox initiator systems include combinations of oxidants (potassium peroxydisulfate, hydrogen peroxide, t-butyl hydroperoxide) and reductants (iron (II), titanium (III), potassium thiosulfite, potassium bisulfite).

In polymerizations where radical-radical termination is solely by disproportionation, the total moles of initiating radicals formed during the polymerization is typically in the range of $10^{-6}$ times to 1.0 times that of the total moles of CTA. By varying the ratio of the total number of moles of the CTA to the total number of moles of the free radical initiator added to a polymerization medium, the polydispersity of the resulting polymer is controlled. Thus, by decreasing the foregoing ratio, a polymer of lower polydispersity is obtained and by increasing the ratio, a polymer of higher polydispersity is obtained.

RAFT polymerizations are suitably carried out with temperatures during the reaction in the range 30° C. to 120° C., preferably in the range 60° C. to 100° C. The polymerization pressure can range from 0 to about 10,000 psig, preferably from about 0 psig to about 1,000 psig.

The process of this invention is typically carried out in solution in batch, semi-batch, or feed mode. The polymerization medium can be chosen from a wide range of media to suit the monomer(s) being used. Suitable polymerization media include: aromatic hydrocarbons, such as, petroleum naphtha or xylenes; fluorocarbons, such as 1,1,1,3,3-pentafluorobutane; partially fluorinated ethers; ketones, such as methyl amyl ketone, methyl isobutyl ketone, methyl ethyl ketone and acetone; esters, such as ethyl acetate, butyl acetate and hexyl acetate; and glycol ether esters, such as propylene glycol monomethyl ether acetate.

The blends of this invention are typically prepared by conventional solution blending methods. Solutions for coating are prepared from weighed quantities of individual constituents. For convenience, weighed portions of polymer stock solutions of known proportions can be employed.

The photoresist compositions of this invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, and 193 nm wavelengths. Imagewise exposure is preferably done with ultraviolet light of 248 nm or 193 nm, wavelengths, and most preferably it is done with ultraviolet light of 193 nm wavelength. Imagewise exposure can either be done digitally with a laser or equivalent device or non-digitally with use of a photomask. Laser light can also be used with a photomask. Digital imaging with a laser is preferred. Suitable laser devices for digital imaging of the compositions of this invention include, but are not limited to, an argon-fluorine excimer laser with UV output at 193 nm and a krypton-fluorine excimer laser with UV output at 248 nm. Since use of UV light of lower wavelength for imagewise exposure corresponds to higher resolution (lower resolution limit), the use of a lower wavelength (e.g., 193 nm) is generally preferred over use of a higher wavelength (e.g., 248 nm or higher).

For use in photoresist applications, the polymers of this invention desirably contain sufficient functionality for development following imagewise exposure to UV light. Preferably, the functionality is acid or protected acid such that aqueous development is possible using a basic developer such as sodium hydroxide solution, potassium hydroxide solution, alkylammonium hydroxide or ammonium hydroxide solution.

When an aqueous processable photoresist is coated or otherwise applied to a substrate and imagewise exposed to UV light, development of the photoresist composition may require that the binder material contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist, the photoresist layer will be removed during development in portions which have been exposed to UV radiation but will be substantially unaffected in unexposed portions. Development of positive-working resists typically consists of treatment by aqueous alkaline systems, such as aqueous solutions containing 0.262 N tetramethylammonium hydroxide, at 25° C. for 2 minutes or less. In case of a negative-working photoresist, the photoresist layer will be removed during development in portions which are unexposed to UV radiation, but will be substantially unaffected in exposed portions. Development of a negative-working resist typically consists of treatment with a critical fluid or an organic solvent.

A critical fluid, as used herein, is a substance heated to a temperature near or above its critical temperature and compressed to a pressure near or above its critical pressure. Critical fluids in this invention are at a temperature that is higher than 15° C. below the critical temperature of the fluid and are at a pressure higher than 5 atmospheres below the critical pressure of the fluid. Carbon dioxide can be used for the critical fluid in the present invention. Various organic solvents can also be used as developer in this invention. These include, but are not limited to, halogenated solvents and non-halogenated solvents. Halogenated solvents are preferred and fluorinated solvents are more preferred. A critical fluid can comprise one or more chemical compounds.

The substrate employed in this invention can illustratively be silicon, silicon oxide, silicon oxynitride, silicon nitride, or various other materials used in semiconductive manufacture.

EXAMPLES

The examples described herein are for illustrative purposes only, and are not meant to limit the scope of the invention.

Chemicals/Monomers

| | |
|---|---|
| Vazo® 601 | 2,2'-azobis(methyl isobutyrate) Waco Chemicals USA (Richmond, VA) |
| PGMEA | Propylene glycol methyl ether acetate Aldrich Chemical Co., Milwaukee, WI |
| MEK | Methyl ethyl ketone Aldrich Chemical Co., Milwaukee, WI |
| THF | Tetrahydrofuran Aldrich Chemical Co., Milwaukee, WI |
| Methacryloyl chloride | Aldrich Chemical Co., Milwaukee, WI |
| $C_6$-ZFM | 1H,1H,2H,2H-perfluorooctyl methacrylate SynQuest Laboratories, Inc. Alachua, FL |
| MAMA | 2-methyl-2-adamantyl methacrylate Idemitsu Kosan Co., Ltd Tokyo, Japan |
| ECPMA | 1-ethyl cyclopentyl methacrylate Osaka Organic Chemical Industry, Ltd. |
| α-GBLMA | α-(γ-butyrolactone) methacrylate Osaka Organic Chemical Industry, Ltd. |

Example 1

Methacrylate Ester of $C_6F_{13}CH_2CH_2C(CH_3)_2OH$

Preparation of 1,1-Dimethyl-2H,2H,3H,3H-perfluorononyl methacrylate

A 3-necked flask fitted with stir-bar, thermocouple, and $N_2$-inlet was charged with 1,1-dimethyl-2H,2H,3H,3H-perfluorononyl alcohol (10.0 g, 24.6 mmol; prepared according to the method disclosed in DE 4026712) and THF (35 mL). The solution was cooled to −10° C. and treated drop-wise with butyl lithium in hexane (15.6 mL, 25 mmol). The resulting mixture was stirred for 15 min and then treated drop-wise with methacryloyl chloride (2.70 g, 25.8 mmol). The mixture was stirred at 0° C. for 1 hr and room temperature for 3 hr. The mixture was filtered and stripped to give crude product (11.85 g) which was kugelrohr distilled to give 10.0 g of colorless oil, b.p. 80° C. (0.2 mm Hg).

$^1$H NMR (THF-$d_8$): 5.98 (m, a=1.00), 5.50 (m, a=1.00), 2.25 ($CH_2CF_2$ m, a=2.1), 2.09 (m, a=2.1), 1.86 (m, a=2.90), 1.53 (s, a=6.2). $^{19}$F NMR: −84.12 (tt, a=2.99), −117 (m, a=2.00), −124.75 (m, a=1.99), −125.7 and −126.13 (bd m's, a=2.09, 1.91), −129.08 (m, a=2.01).

The monomer was passed through a short column of neutral alumina before use in polymerization.

Example 2

Block Copolymer of ECPMA/MAMA/α-GBLMA and 1,1-Dimethyl-2H,2H,3H,3H-perfluorononyl Methacrylate A 3-neck flask fitted with nitrogen gas inlet and adaptor to vacuum, thermowell, and stir-bar is charged with trithiocarbonate RAFT agent $C_{12}H_{25}SC(S)SC(CH_3)(CN)CH_2CH_2CO_2CH_3$ (14.4 g=34.6 mmol), methyl ethyl ketone (105 ml), ECPMA (58.3 mmol), MAMA (145 mmol), α-GBLMA (242 mmol), Vazo® 601 (5.25 mmol), and sodium bicarbonate $NaHCO_3$ (0.5 g). The reactor is filled with nitrogen, and two more evacuation/fill cycles are performed. The temperature is increased to 67° C. over 0.5 hr, and then maintained for 22 hr.

The solution is diluted with MEK (150 ml), cooled to room temperature, filtered through glass fiber paper, and added slowly to heptane (3500 ml) dropwise with rapid stirring. ECPMA/MAMA/α-GBLMA polymer can be collected by filtration and air-dried to give the desired terpolymer.

A 3-neck flask fitted with condenser, addition funnel, $N_2$-inlet with adaptor to vacuum, thermowell, and stir-bar is then charged with a random terpolymer of ECPMA/MAMA/α-GBLMA (10.9 g), MEK (15 mL), $NaHCO_3$ (50 mg), and Vazo® 601 (FW=230.26, 145 mg, 0.63 mmol). A solution of 1,1-dimethyl-2H,2H,3H,3H-perfluorononyl methacrylate (FUDMA, 5.9 g, prepared as in Example 1) in MEK (4 mL) is charged to the addition funnel. A small volume of monomer solution (0.25 mL) is added, and the reaction mixture is heated to 70° C. The remaining monomer is added over 3 hr. The temperature is maintained for 22 hr.

The cooled reaction mixture is diluted with MEK (20 mL), filtered to remove sodium bicarbonate, and added dropwise to 800 mL methanol. The precipitated polymer is filtered, washed with methanol, and dried to give the desired block copolymer.

Example 3

Block Copolymer of ECPMA/MAMA/α-GBLMA and 1H,1H,2H,2H-Perfluoroctyl Methacrylate A 3-neck flask fitted with condenser, addition funnel, $N_2$-inlet with adaptor to vacuum, thermowell, and stir-bar is charged with a random terpolymer of ECPMA/MAMA/α-GBLMA (prepared as in Example 2; 10.9 g), MEK (15 mL), $NaHCO_3$ (50 mg), and Vazo® 601 (FW=230.26, 145 mg, 0.63 mmol). A solution of 1H,1H,2H,2H-perfluorooctyl methacrylate (5.36 g) in MEK (4 mL) is charged to the addition funnel. A small volume of monomer solution (0.25 mL) is added, and the reaction mixture is heated to 70° C. The remaining monomer is added over 3 hr. The temperature is maintained for 22 hr.

The cooled reaction mixture is diluted with MEK (20 mL), filtered to remove sodium bicarbonate, and added dropwise to 800 mL methanol. The precipitated polymer is filtered, washed with methanol, and dried to give the desired block copolymer.

Example 4

Fluorinated copolymer from Example 2 can be used to prepare a series of 12 wt % solutions of ECPMA/MAMA/α-GBLMA (12/31/57) in a solvent mixture of 60/40 (vol ratio) PGMEA/ethyl lactate. Typically, the weight fraction of fluorinated copolymer ranges from 0 to 100%, and includes specific compositions with 1/2, 1/4, 1/9, 1/29, 1/100, and 1/285 ratios. Films can be prepared by spin-coating filtered (0.2 μm) solutions on silicon wafers at 1000 rpm. Films are thermally annealed in a 70° C. oven for 0.5 hr before measurement of water contact angles (advancing and receding) and hexadecane contact angles (advancing and receding.

Contact angle (CA) measurements to determine the water and hexadecane contact angles on a sample surface can be performed using a Ramé-Hart Standard Automated Goniometer (Model 200) employing DropImage® standard software and equipped with an automated dispensing system. To determine the contact angle of the test fluid on the sample, the sessile drop method is typically used. Approximately one drop of test fluid is dispensed onto the sample using an automated dispensing pump to dispense a calibrated amount of the test fluid. For water measurements, deionized water is employed, and for oil measurements, hexadecane is suitably employed. The advancing angle is the contact angle when the three phase line is advanced over the surface. The receding contact angle is the contact angle when the three phase line is withdrawn from a partially wetted surface. The difference between the advancing and receding contact angles is known as the contact angle hysteresis. The lower the hysteresis, the less stable the water droplet is on the surface and the easier it is for the droplet to slide off of the surface.

Example 5

Fluorinated copolymer from Example 3 can be used to prepare a series of 12 wt % solution blends with ECPMA/MAMA/α-GBLMA (12/31/57) in a solvent mixture of 60/40 PGMEA/ethyl lactate. The weight fraction of fluorinated copolymer typically ranges from 0 to 100%, and includes specific compositions with 1/2, 1/4, 1/9, 1/29, 1/100, and 1/299 ratios. Films can be prepared by spin-coating filtered (0.2 μm) solutions on silicon wafers at 1000 rpm. Films are thermally annealed in a 70° C. oven for 0.5 hr before measurement of water contact angles (advancing and receding) and hexadecane contact angles (advancing and receding.

Example 6

Open-Frame Imaging of (ECPMA/MAMA/α-GBLMA)-b-(FUDMA) in Blends with ECPMA/MAMA α-GBLMA Solutions for spin-coating on silicon wafers are typically prepared using 0.60 g polymer, 0.018 g triphenylsulfonium nonaflate and PGMEA/ethyl lactate (60/40 volume ratio) to make a 5.00 g solution.

Spin coating is done using a Brewer Science Inc. Model-100CB combination spin coater/hotplate on a 4 in (101.6 mm) diameter Type "P", <100> orientation, silicon wafer. The wafer is primed with hexamethyldisilazane (HMDS) using a YES® vapor prime oven.

Solutions are filtered first through a 0.45 μm membrane, then again through a 0.2 μm membrane just before spin-coating. Typical coating conditions are: spin rate=1500 rpm; post-application bake=110° C. for 60 sec.

248 nm imaging is accomplished by exposing the coated wafer to light obtained by passing broadband UV light from an ORIEL Model-82421 Solar Simulator (1000 watt) through a 248 nm interference filter which passes about 30% of the energy at 248 nm. Exposure time is 45 se, providing an unattenuated dose of 60 mJ/cm². By using a mask with 18 positions of varying neutral optical density, a wide variety of exposure doses can be generated. After exposure the exposed wafer is baked at 135° C. for 60 sec. In addition to exposures made in air, exposures can be made with the coated wafer immersed in a shallow tray of water.

After exposure, the wafer is tray-developed in aqueous tetramethylammonium hydroxide (TMAH) solution (2.38% TMAH solution).

We claim:

1. A composition comprising a block copolymer of the form $A_m$-$B_n$ with Mw =2,000-25,000, wherein
   m is an integer from 4-75;
   n is an integer from 2-20;
   each A is independently selected and is a repeat unit derived from an acrylic monomer, $CH_2=CR^1CO_2R^2$, wherein
   $R^1$ is selected from the group consisting of H, F, $C_1$-$C_5$ alkyl, and $C_1$-$C_5$ fluoroalkyl;
   $R^2$ is $—C(R^7)(R^8)—[C(R^9)(R^{10})]_q—C(R^{11})(R^{12})—OH$,
   wherein
   q=0, 1, 2, 3, 4 or 5;
   $R^7$ and $R^8$ are independently selected from the group consisting of $C_1$-$C_6$ alkyl and $C_1$-$C_6$ alkyl substituted with an ether oxygen; or $R^7$ and $R^8$ taken together form a 3- to 8-membered ring, optionally substituted with an ether oxygen, provided that the carbon attached to $R^7$ and $R^8$ is not at a bridgehead position;
   $R^9$ and $R^{10}$ are independently selected from the group consisting of H, $C_1$-$C_6$ alkyl, and $C_1$-$C_6$ alkyl substituted with an ether oxygen; or $R^9$ and $R^{10}$ taken together form a 3- to 8-membered ring, optionally substituted with an ether oxygen;
   $R^{11}$ and $R^{12}$ are independently selected from the group consisting of H, $C_1$-$C_6$ alkyl, and $C_1$-$C_6$ alkyl substituted with an ether oxygen; or $R^{11}$ and $R^{12}$ taken together form a 3- to 8-membered ring, optionally substituted with an ether oxygen; or
   $R^7$ and $R^{11}$ taken together with $—[C(R^9)(R^{10})]_q—$ form a 4- to 8-membered ring, provided that the carbon attached to $R^7$ and $R^8$ is not at a bridgehead position; and
   each B is independently selected and is a repeat unit derived from $CH_2=CR^3CO_2R^4$, wherein
   $R^3$ is selected from the group consisting of H, F, $C_1$-$C_5$ alkyl, and $C_1$-$C_5$ fluoroalkyl; and
   $R^4$ is selected from the group consisting of $—C(R^5)(R^6)(CH_2)_pR_f$, $—C(R^5)((CH_2)_pR_f)_2$, $—(CH_2)_pR_f$, and $—(CH_2)_pO(CH_2)_pR_f$, wherein
   p is an integer from 1 to 4;
   $R_f$ is $C_2$-$C_{14}$ perfluoroalkyl; and
   $R^5$ and $R^6$ are independently selected from the group consisting of H, $C_1$-$C_3$ alkyl, or taken together form a 5- or 6-membered ring.

* * * * *